United States Patent [19]
Iuchi et al.

[11] Patent Number: 6,070,549
[45] Date of Patent: Jun. 6, 2000

[54] POINTER TYPE INDICATING DEVICE

[75] Inventors: Kazuto Iuchi; Kazuyuki Takenouchi; Yasuyuki Watanabe, all of Shizuoka, Japan

[73] Assignee: Yazaki Corporation, Tokyo, Japan

[21] Appl. No.: 08/760,518

[22] Filed: Dec. 5, 1996

[30]     Foreign Application Priority Data

Dec. 7, 1995 [JP] Japan .................................. 7-318952

[51] Int. Cl.[7] .................................................. G01D 11/28
[52] U.S. Cl. ............................ 116/287; 116/288; 362/23; 362/26; 362/31
[58] Field of Search .................................... 116/284, 286, 116/287, 288; 362/23, 26, 27, 28, 29, 31

[56]             References Cited

U.S. PATENT DOCUMENTS

| 4,714,983 | 12/1987 | Lang | 362/27 |
|---|---|---|---|
| 5,084,698 | 1/1992 | Sell | 116/288 |
| 5,458,082 | 10/1995 | Cookingham | 362/23 |
| 5,703,612 | 12/1997 | Salmon et al. | 362/23 |
| 5,741,058 | 4/1998 | Suzuki et al. | 362/23 |

FOREIGN PATENT DOCUMENTS

| 534 054 | 12/1954 | Belgium . |
|---|---|---|
| 0 616 921A2 | 9/1994 | European Pat. Off. . |
| 2 220 963 | 10/1974 | France . |
| 43 25 128A1 | 2/1995 | Germany . |
| 51-11356 | 1/1976 | Japan . |
| 5-319140 | 12/1993 | Japan . |

OTHER PUBLICATIONS

Abstract—"Indicator for Automotive Instrument", vol. 10, No. 149 (P–461) (2206), May 30, 1986 [JP61–3010(A) Daihatsu Kogyo K.K., Appl. No. 59–124285].

*Primary Examiner*—Diego Gutierrez
*Assistant Examiner*—Andrew Hirshfeld
*Attorney, Agent, or Firm*—Armstrong, Westerman, Hattori, McLeland, & Naughton

[57]            ABSTRACT

A pointer type indicator having a structure in which internal mechanisms and illuminating light sources are directly connected to an optical guide plate through the medium of a circuit board, and is capable of brightly illuminating pointers and indexes. The pointer type indicator comprises a dial plate provided with a transparent indexes corresponding to information to be indicated, a pointer provided adjacent to a front face of the dial plate, an optical guide plate provided adjacent to a back face of the dial plate for guiding the illuminating light transmitted from an illuminating light source to the entire area of the front face of the dial plate, a circuit board having at least a circuit pattern formed thereon, said circuit pattern being used for transmitting an electric signal, and an electric element operated by the signal fed from the circuit board, which electric element is fixed to a back face of the optical guide plate through the medium of the circuit board, whereby a light reflecting member is provided on a surface of the circuit board which faces to the optical guide plate.

10 Claims, 8 Drawing Sheets

POINTER TYPE INDICATING DEVICE

BACKGROUND OF THE INVENTION

1. Field of the Invention

The present invention relates to a pointer type indicator for indicating a measured value with use of a pointer, and more particularly, to a structure improved in assembling electric elements.

2. Description of the Prior Art

Heretofore, this kind of pointer type indicator has been used as a fuel gauge for indicating an amount of remaining fuel, a water temperature gauge for indicating a temperature of water coolant, or a voltmeter for indicating a voltage of a battery, in a vehicle such as a motor vehicle or the like.

Also, a meter device in which a plurality of different measured values as mentioned above are respectively indicted by employing a plurality of indicating mechanism is called a combination meter, and has been widely used.

For example, Japanese Patent Application Laid Open No. 5-319140 (which will be referred to as a "first conventional device") discloses an example of such a combination meter.

The first conventional device comprises a dial plate with transparent index portion formed in the front surface thereof, according to items to be indicated, such as an amount of remaining fuel, speed of a vehicle, RPM of an engine, temperature of a water coolant and the like, pointers provided for respective measured values, an optical guide plate made of transparent resin material, a circuit board with a wiring pattern for signal transmission, and the internal mechanism for driving the indicator pointers.

The optical guide plate is provided on the back side of the dial plate, and the circuit board is provided in the back side of the optical guide plate.

Through holes are formed in the dial plate, the optical guide plate, and the circuit board, such that the holes penetrates these plates and board. Drive shafts extending from the back side are exposed through the holes. The drive shafts are mounted on the respective internal mechanism, and are driven and rotated in accordance with electric signals corresponding to the measured values.

The pointers are mounted to the drive shafts from the front side of the dial plate. Thus, the pointers are driven to respective angles corresponding to the measured values in accordance with electric signals supplied to the internal respective mechanism.

On the contrary, the internal respective mechanism for driving the pointers is positioned at the back side of the circuit board, and is fixed to the optical guide plate through the circuit board. Through this fixture, the electric connection between the internal respective mechanism and the circuit board can be performed.

Illuminating light from a light source is introduced into the optical guide plate, and the indexes formed in the dial plate and the pointers are illuminated by the illuminating light.

The light source for providing the illuminating light to the optical guide plate is formed into a module, and is fixed to the optical guide plate through the circuit board, like the internal mechanism as explained above. This fixture serves to form electric connection between the illumination module and the circuit board.

Since the conventional device as described above is constructed such that the internal respective mechanism and the illuminating light source or light source module are directly connected to the optical guide plate, advantages are obtained in that the number of components is reduced and that thus provided device has a small size.

However, in the first conventional device, since a member for diffusing the illuminating light is constituted only by the optical guide plate which is relatively thin, there is a problem that it is difficult to illuminate clearly and uniformly the entire dial plate because of loss of light introduced into the optical guide plate.

The problem of the first conventional device as described above can be solved, for example, by a technique of a device (which will be hereinafter referred to as a "second conventional device") disclosed in a micro-film of Japanese Utility Model Application Laid Open No. 51-11356.

Specifically, the second conventional device is provided with a first reflecting layer which is in contact with the optical guide plate and covers the back surface thereof, and a second reflecting layer from which figures of characters are removed. In this manner, illuminating light introduced into the optical guide plate is repeatedly reflected by the first and second reflecting layers so that illuminating light extends over the entire area of the optical guide plate.

In the optical guide plate of the first conventional device as described above, rugged portions are formed on the periphery or the surface of the optical guide plate in order to ensure the strength of the plate itself as a component, to make connection with another component, or to guide the illuminating light to pointers if the display device is equipped with illuminated pointers.

Accordingly, if the teaching of the second conventional device is intended to aggregate with the first conventional device, it is necessary to take such rugged portions into consideration.

In this case, it is difficult to adopt a normal thermal transfer method for forming reflecting layers as described above, and therefore, the reflecting layers must be formed by any different method such as a spray coating method for applying reflective material or the like.

If such a different type of applying method is employed, the manufacturing process becomes complicated, and resulting in problems of lowering the yield rate and increasing the manufacturing cost for manufacturing a required device.

SUMMARY OF THE INVENTION

The present invention has been made in view of eliminating the problems above. It is therefore an object of the present invention to provide a pointer type indicator, which has a structure being capable of facilitating manufacturing process thereof and decreasing a manufacturing cost, wherein the internal respective mechanism and a light source are coupled to an optical guide plate through a circuit board and pointers as well as indexes can be clearly illuminated.

In order to achieve the objective described above, according to a first aspect of the present invention, a light reflecting member is provided on a surface of the circuit board which faces to the optical guide plate of a pointer type indicator which comprises a dial plate provided with transparent index portion corresponding to information to be indicated, pointers provided adjacent to the front of the dial plate, an optical guide plate provided adjacent to the back of the dial plate for guiding illuminating light from a light source to the whole area of the front of the dial plate, a circuit board having at least a circuit pattern formed thereon for communicating electric signals, and electric elements to be operated by the signals fed from the circuit board and arranged at the back face of the optical guide plate through the circuit board.

According to another aspect of the invention, the pointer type indicator is characterized in that the light reflecting member is a highly reflective printed layer and formed on the circuit board.

According to still another aspect of the invention, the pointer type indicator is characterized in that the light reflecting member is a sheet-like member independent from the circuit board.

According to yet another aspect of the invention, the pointer type indicator is characterized in that the light reflecting member is formed as a white reflecting surface.

According to further aspect of the invention, the pointer type indicator is characterized in that a crimped reflecting region is provided on the optical guide plate facing the light reflecting member .

According to still further aspect of the invention, the pointer type indicator is characterized in that the dial plate comprises a optical guide member formed of a plate-like transparent material, a light reflecting layer formed on a front surface of the optical guide member and covering the whole area of the front surface of the optical guide member, and a non-transparent layer formed on a front surface of the light reflecting layer and provided with index portion formed into transparent, wherein the light reflecting layer allows to pass a portion of the illuminating light from the back of the dial plate which is directed toward the index portion, and reflects the remaining portion of the illuminating light, which is directed toward a portion other than the index portion, toward the back face of the dial plate.

According to yet further aspect of the invention, the pointer type indicator is characterized in that the light reflecting layer is formed of a transparent material of white-based color.

According to another aspect of the invention, the pointer type indicator is characterized in that the dial plate and the optical guide plate are separated with a predetermined distance from each other to make a space therebetween.

According to still another aspect of the invention, the pointer type indicator is characterized in that a second light reflecting member is provided, on a back face of the optical guide member, in contact with the optical guide member having transparent windows corresponding to the index portion formed on the second light reflecting member.

According to yet another aspect of the invention, the pointer type indicator according to the present invention is characterized in that the circuit board is formed of a flexible circuit board.

According to further aspect of the invention, the pointer type indicator is characterized in that contacts for the circuit board are provided on the back face of the circuit board to make an electric connection with the electric elements, a flange is projected and formed, at a front side of the respective electric elements, to fix the electric elements to the back face of the circuit board, contacts of the electric elements are held between the circuit board and the respective flanges and fixed by fixing means, and thereby an electrical connection is provided simultaneously with the fixing of the electric elements.

According to the present invention, an optical guide plate, a circuit board and an electric element are provided in this order on the back face of the dial plate.

Since the electric elements positioned in the closest to the back face of the device among these components is mounted on the optical guide plate through the circuit board, the optical guide plate, the circuit board and the electric elements are fixed by putting one upon another through the installation of the electric elements.

The surface of the circuit board which faces against the optical guide plate is provided with light reflecting member.

In the fixed state as described above, the light reflecting member is positioned adjacent to the back face of the optical guide plate and reflects the illuminating light introduced into the optical guide plate toward the front.

Further, since the circuit board is formed into a flat plate, the light reflecting member can be provided on this circuit board and, therefore, the manufacturing steps are greatly facilitated, the yield rate of manufacturing is improved and the pointer device can be manufactured at a low production cost.

The light reflecting member according to the present invention can be formed, for example, as a high reflecting printed layer on the circuit board as described above in relating to the aspect of the present invention.

Since the light reflecting member can be formed as the high reflecting printed layer, it is possible to form a light reflecting member by a thermal transfer method as described above, so that steps of manufacturing the pointer type indicator can be facilitated and the yield rate can be improved. According to this formation, the light reflecting member can be made thin.

Further, the light reflecting member can be formed, for example, into a sheet-like member, as described above according to the present invention.

Accordingly, by forming the light reflecting member into the sheet-like member, it is possible to provide the light reflecting member with use of an adhesive tape or by adhesion, so that the steps of manufacturing the pointer device can be facilitated and the yield rate thereof can be improved.

Further, the surface of the light reflecting member is formed, for example, into a white reflecting surface as described above according to the present invention.

Accordingly, by forming the surface of the light reflecting member, i.e., the reflecting surface into the white reflecting surface, the indexes provided on the dial plate can be illuminated in white under influence of the surface color of the light reflecting member, so that the recognition of the indexes can be improved greatly.

Further, crimped regions are provided on the surface of the optical guide plate which faces the light reflecting member in the above structure, for example, as described above in relating to the aspect of the present invention. These crimped regions function as a light diffusion surface which diffuses and reflects the illuminating light being introduced.

According to this feature, since a crimped reflecting regions are provided on the surface of the optical guide plate, a part of the illuminating light directed toward the back face of the optical guide plate, which reaches to the crimped reflecting regions, will be reflected and diffused forwards, so that the whole dial plate can be illuminated uniformly and brightly.

Further, in another configuration, a light reflecting layer is inserted between the optical guide member which forms a part of the dial plate and the non-transparent member.

The light reflecting layer of this configuration is formed, for example, by a reflecting layer of white-based transparent material or the like which simultaneously transmits and reflects the illuminating light reached to the surface of the layer.

According to this configuration, a part of the illuminating light directed toward the indexes by the reflecting layer is reached to the indexes after passing through the inside of the light reflecting layer, while the other part of the illuminating light which does not directed to the indexes is reflected by the light reflecting layer due to presence of a non-transparent layer therebehind and is then directed toward the back face, i.e., the light reflecting layer of the circuit board as described above. Therefore, the indexes and the whole dial plate will be simultaneously illuminated brightly.

Further, according to the present invention, the dial plate and the optical guide plate are separated with a predetermined distance from each other to make a space therebetween.

In this configuration, since a refractive index of the space is different from that of the optical guide member of the dial plate or that of the optical guide plate, the illuminating light is totally reflected at the boundary plane of the space, or otherwise travels toward the neighboring area or the space, the optical guide member and optical guide plate depending on an angle of incidence.

Further, when the illuminating light traveling in the space toward the circuit board after being reflected by the back face of the optical guide member is reflected by the boundary plane of the space, such reflected illuminating light starts to travel again toward the back face of the optical guide member.

In this case, a traveling distance to the next reflection of the illuminating light after being reflected once is shortened, so that the number of times of reflection is increased. Therefore, it is possible to provide more uniform illumination in accordance with the present invention.

Further, according to the present invention, a light reflecting layer is formed on the front face of the optical guide member and a second light reflecting member is provided on the back face of the optical guide member in contact therewith.

In addition, transparent windows are formed in the second light reflecting member correspondingly to the indexes formed in the dial plate.

In this configuration, a part of the illuminating light traveling toward the dial plate, after being reflected by the light reflecting member of the circuit board, passes through the transparent windows provided in the second light reflecting member and reaches the indexes, while the other part of the illumination light is reflected by the second light reflecting member and travels again toward the circuit board.

Accordingly, in this structure, the other part of the illuminating light which is not used for illuminating the indexes are positively reflected back toward the circuit board, the illumination efficiency can be much more improved.

Further, the circuit board in the structure as described above is, for example, formed of a flexible circuit board.

Since this flexible circuit board is formed as a thin plate member having a flexibility, formation of a light reflecting member can be facilitated, and the flexible circuit board can be easily treated and adhered on the optical guide plate. Further, the flexible circuit board can be easily matched with shapes of rugged portions on the back face of the optical guide plate, such rugged portions are formed by the electric elements and other members projecting from the back face of the optical guide plate.

Further, according to another feature of the present invention, contacts are provided on the back face of the circuit board to make an electric connection with the electric elements. On the other hand, extruded flanges are formed at the front side of the respective electric elements.

In addition, when the electric elements are installed on the circuit board, contacts of the respective electric elements are inserted between the flange and the contacts of the circuit board, and the flange and the circuit board are fixed tightly.

Thus, according to this structure, since the contacts of the respective electric elements are sandwiched by the circuit board and the extruded flange of the respective electric elements for the installation and that the flange and the circuit board are held and fixed tightly, the electric connection of the electric elements with the circuit board can be performed simultaneously with the installation of the electric elements.

DETAILED DESCRIPTION OF THE PREFERRED EMBODIMENTS

Figure 1:
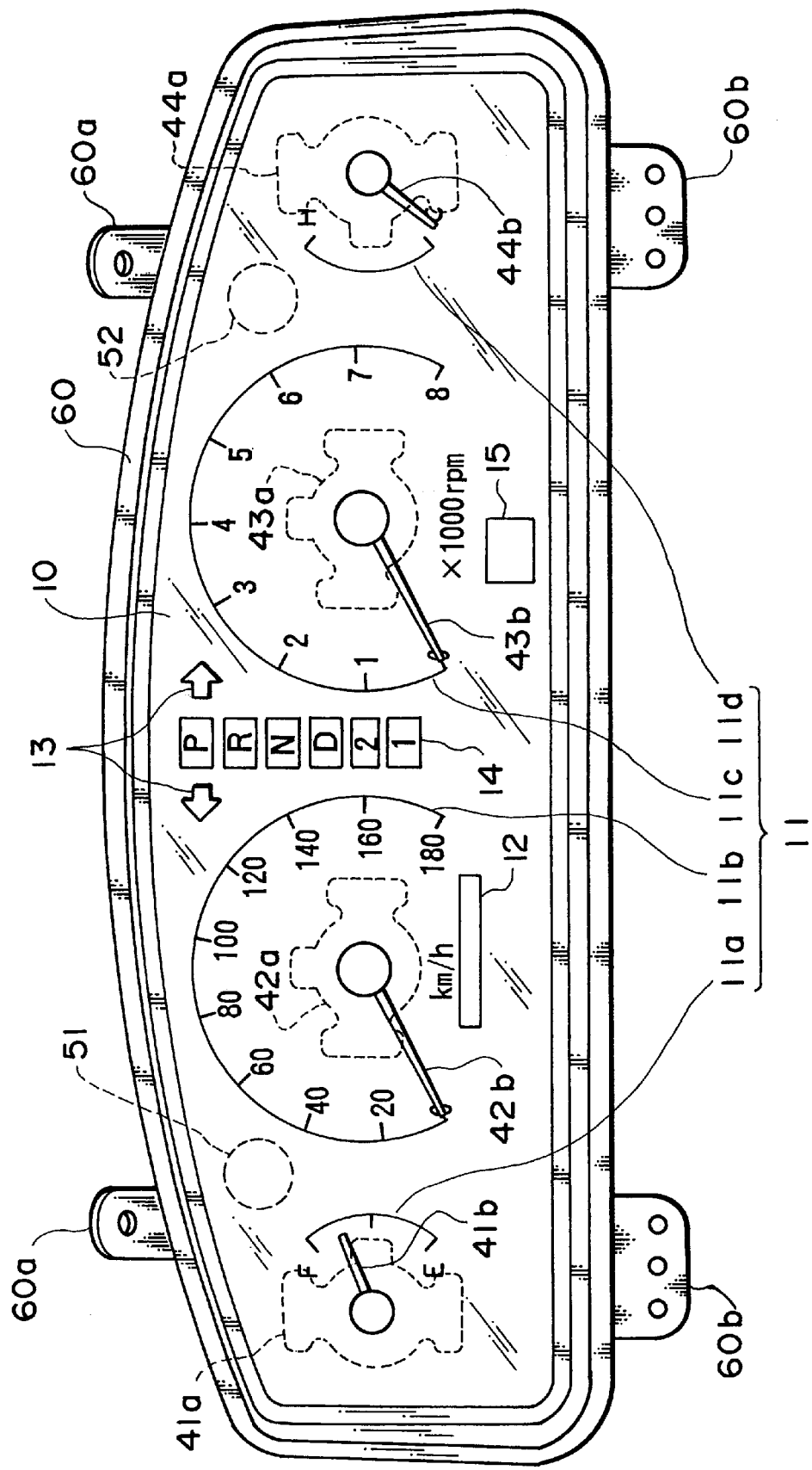
FIG. 1 is a front view of a pointer type indicator.
Figure 2:
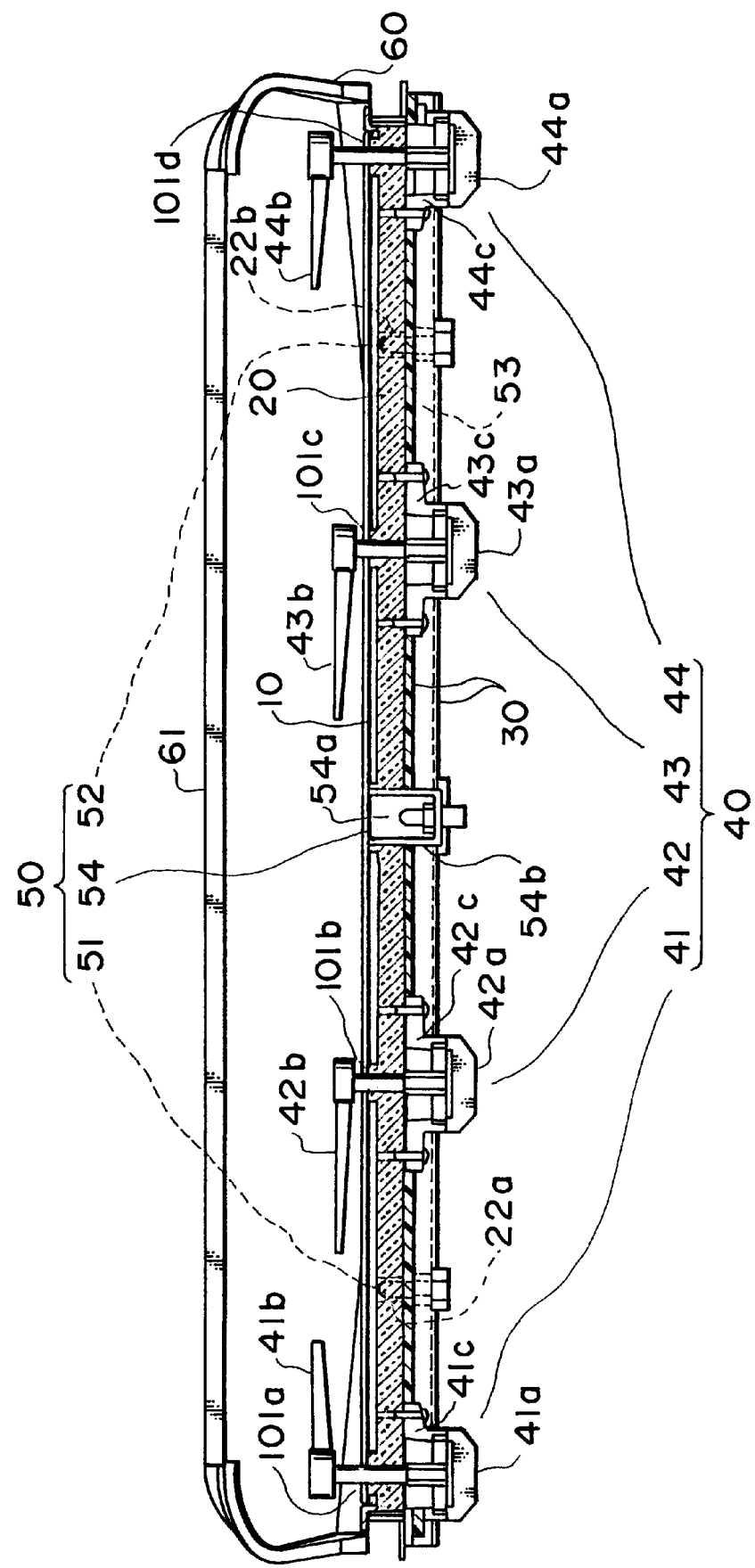
FIG. 2 is a lateral cross-sectional view of the pointer type indicator illustrating the internal structure thereof.
Figure 3:
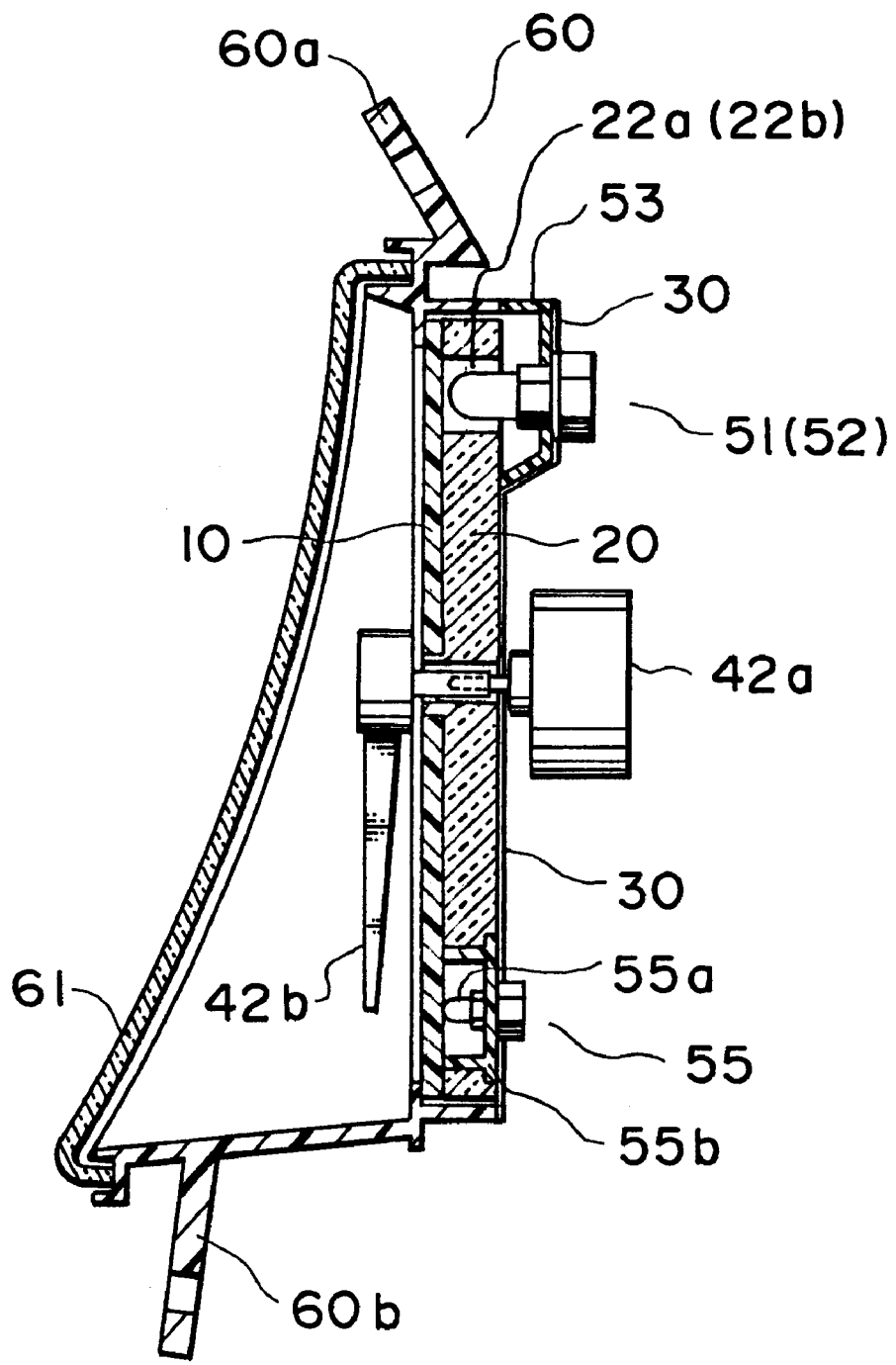
FIG. 3 is a longitudinal cross-sectional view of the pointer type indicator illustrating the internal structure thereof.

In the following, preferred embodiments of the present invention will be explained with reference to the drawings. FIGS. 1 to 3 are views for explaining the structure of a pointer type indicator (hereinafter referred to as a "display device") which embodies the present invention. FIG. 1 is a front view of the display device, FIG. 2 is a lateral cross-sectional view showing the internal structure of the display device, and FIG. 3 is a longitudinal cross-sectional view thereof. The following explanation will be made with reference to these figures.

As shown in FIG. 1, a dial plate 10 is provided in the front side of the display device, and this plate 10 is elongated in the lateral direction and has a deformed rectangular shape whose upper portion (the upper part of the figure) is bent outwardly.

The dial plate 10 is fixed in such a manner as being embedded in an end plate 60 which surrounds the dial plate 10. Pairs of mounting protrusions 60a and 60b are provided respectively at upper and lower parts of the end plate 60.

At the front side of the dial plate 10, a front face plate 61 is provided as shown in FIG. 3. This front face plate 61 is mounted on the end plate 60, covering and sealing the internal space surrounded by the end plate and the front surface plate 61 for preventing dusts from entering and simultaneously preventing incident external light from reflecting.

Meanwhile, at the front face of the dial plate 10, holes for use in mounting transparent indexes which corresponds to information to be indicated and other various members are provided.

More specifically, holes 101a to 101d are formed on the front face of the dial plate 10, as shown in FIG. 2. Further, there are provided index portion 11 for designating indicating values of various information, a distance information display window, or odometer window, 12 for displaying information concerning a distance traveled by motor vehicle, winker display windows 13, shift position indicating windows 14 for displaying shift positions of an automatic transmission vehicle, a warning display window 15 for displaying warning information and the like as shown in FIG. 1.

Note that a non-transparent layer (described later) which constitutes a background color (e.g., black) of the plate 10 and which does not allow the illuminating light to pass is provided at the front face of the dial plate 10.

The index portion 11 consists of a plurality of different indexes depending on types of indications to be displayed such as, from left to right in the drawing, a fuel index 11a for indicating remaining amount of fuel, a speed index 11b for displaying the traveling speed, an RPM index 11c for displaying the revolution of the engine, and a water temperature index 11d for displaying a temperature of water coolant water.

Note that the indexes 11a to 11d are formed as transparent indexes, i.e., characters punched in the non-transparent layer provided on the dial plate 10. These indexes are illuminated by illuminating light from the back side.

The distance information display window 12 is formed at a position underneath the speed index 11b and displays distance information of a plurality of figures consisting of digital segments with use of the mechanism of a distance display (not shown).

The winker display windows 13 are formed at a position above the center of the dial plate 10 in a lateral direction and displays flashing light from winker bulbs (not shown) provided at the back side of the dial plate in accordance with the operation of a winker system.

The shift position indicating windows 14 consist of a plurality of windows disposed vertically at the central part of the dial plate in the lateral direction. The respective windows are illuminated correspondingly to the turn on and off of shift position indicating bulbs (described later) provided at the back side of the dial plate 10 in accordance with the operation of shifting.

The warning display window 15 is formed at a position underneath the engine RPM index 11c described above, and this window 15 is illuminated by a warning bulb (described later) provided at the back side of the dial plate 10 upon occurrence of an abnormal condition.

Next, the internal structure of the display device will be described.

As shown in FIGS. 2 and 3, an optical guide plate 20 is provided on the back face of the dial plate 10. This optical guide plate is made of transparent resin material, such as an acrylic resin plate, a polycarbonate resin plate or the like. More specifically, this optical guide plate 20 has a structure shown in FIG. 4.

Figure 4:
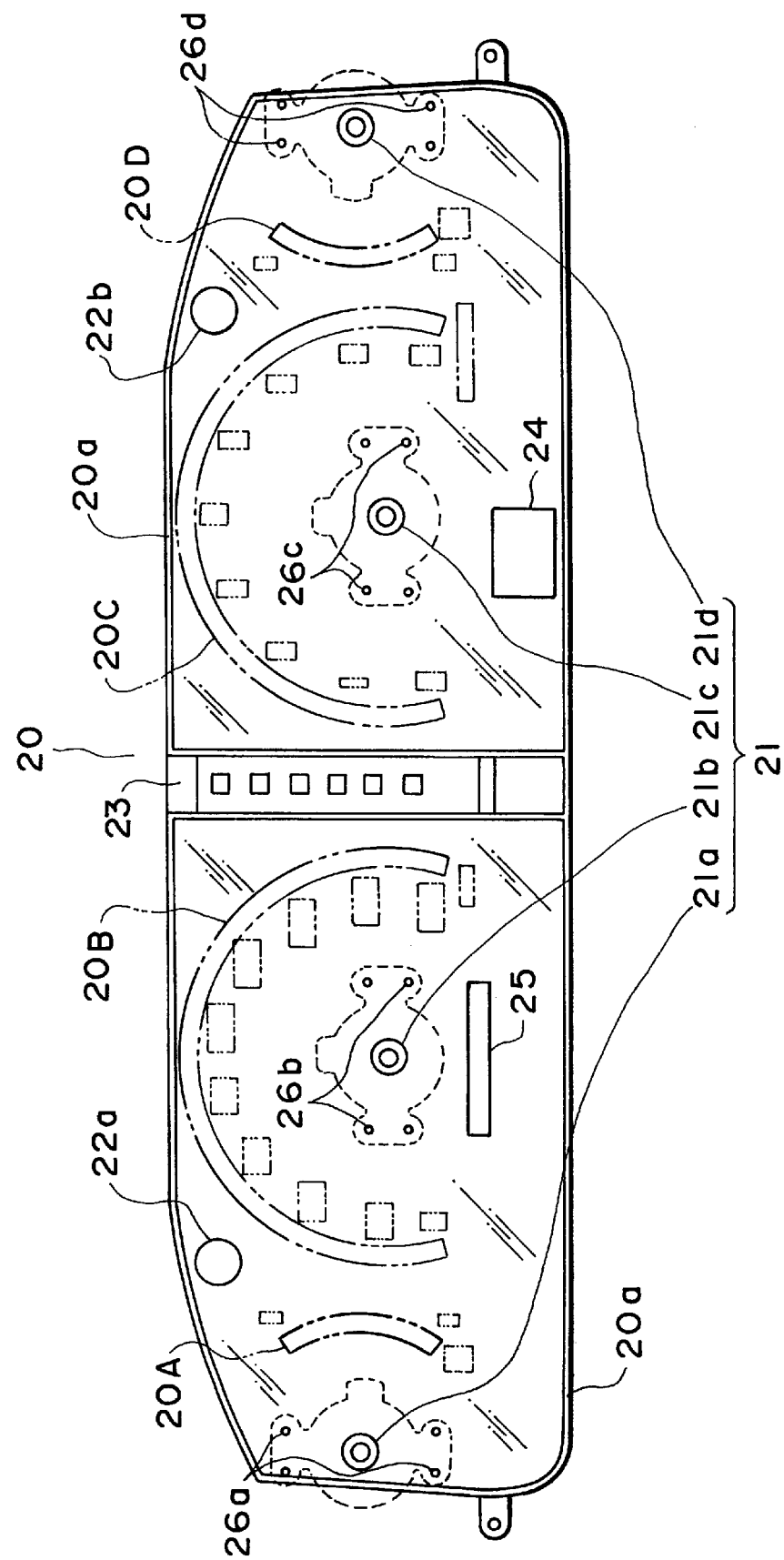
FIG. 4 is a front view illustrating the structure of an optical guide plate.

As shown in FIG. 4, the optical guide plate 20 is formed into a plate-like member substantially having the same shape as that of the dial plate 10, and a reinforcing rib 20a is provided at the peripheral portion of the optical guide plate 20 so as to stand from the plane of the optical guide plate 20 to increase strength of the optical guide plate.

In addition, shaft holes 21, illumination bulb insertion holes 22a and 22b, a shift position illuminator installation section 23, a warning illuminator installation hole 24, a distance information indicator mounting hole 25, and mounting holes 26a to 26d for mounting the mechanism of indicators, which will be described herein-after, are provided at the flat portion of the optical guide plate 20.

The plurality of shaft holes 21 are formed as through holes through which drive shafts of the respective mechanism of the indicators penetrate and provided correspondingly with different types of measured values to be displayed by the respective mechanism of indicators.

More specifically, the shaft hole 21a is provided for the mechanism of indicator to indicate an amount of remaining fuel, a shaft hole 21b for the mechanism of indicator to indicate a travel speed, a shaft hole 21c for the mechanism of indicator to indicate an engine RPM, and a shaft hole 21d for the mechanism of indicator to indicate a temperature of water coolant.

In addition, the shaft holes 21 also function as light transmitting members for directing illuminating light, which is traveling through the optical guide plate 20, toward respective pointers described later to introduce the illuminating light therein.

Therefore, each of the shaft holes 21 has a cylindrical portion protruding vertically from the plane of the optical guide plate.

The illumination bulb insertion holes 22a and 22b are formed at upper and edge portions of the optical guide plate 20 in a lateral direction.

More specifically, as shown in the drawings, the illumination bulb insertion hole 22a is formed at the upper portion in-between index regions 20A and 20B which correspond respectively to the remaining fuel display index 11a and the speed display index 11b. The illumination bulb insertion hole 22b is formed at the upper portion in-between index regions 20C and 20D which correspond respectively to the engine RPM display index 11c and the water temperature display index 11d.

The shift position illuminator installation section 23 consists of a section at where the shift position illuminator (described hereinafter) is installed, and is provided at the central part of the optical guide plate 20 in normal to the width thereof.

The warning illuminator installation hole 24 is provided by a portion at where the warning illuminator (described later) is installed, and is provided at a lower part of the optical guide plate 20 under the index region 20C which corresponds to the engine RPM display index 11c.

The distance information indicator installation hole 25 is formed of a window through which a display of a distance indicator (not shown) can be seen, and is provided at a lower part of the optical guide plate 20 under the index region 20B which corresponds to the vehicle speed display index 11b.

The mounting holes 26a to 26d are provided by screw holes for mounting the mechanism of indicators which will be described later.

In addition, the index regions 20A to 20D are formed into crimping regions provided by a step of crimping process.

The step of crimping process is meant by processing for forming a pattern of small rugged portions in the surface of material, e.g., a wrinkle pattern like a surface of leather or a cloth, a sandy pattern with randomly distributed dot-like rugged portions, a cross stripes pattern formed by a plurality of stripes crossing each other.

Further, the crimping regions serve as light diffusing/reflecting surfaces which diffuse and reflect incident light.

Therefore, as of the illuminating light in the optical guide plate 20, a part of illuminating light reflected at the regions 20A to 20D is diffused so as to directed upwards, or to the upper surface side, while the remaining part of illuminating reflected at the regions other than the regions 20A to 20D travels far off.

Note that the crimping regions of the index regions 20A to 20D are not limited only to the types as described above but to other types of crimping regions as long as they have small rugged portions which diffuse and reflect the illuminating light.

The optical guide plate 20 having a structure as described above is mounted on the end plate 60 as being abutted to the back face of the dial plate 10.

As shown in the drawings, a printed circuit board 30 is provided on the back face of the optical guide plate 20 in such that the circuit board 30 is contacted with the optical guide plate 20 and covers the entire region of the optical guide plate 20.

The printed circuit board 30 is formed of a flexible circuit board made of a thin flat member having a flexibility, and is adhered on the back face of the optical guide plate 20 by a double-sided adhesive tape or a transparent adhesion.

In addition, a high reflective printed layer consisting of, for example, white paint, is provided by printing as a light reflecting member on the surface of the printed circuit board 30 which faces the optical guide plate 20. The high reflective printed layer is formed on the printed circuit board 30 by hot stamp printing processing, e.g., thermal transfer of a paint layer, or by screen printing.

Further, as has been described above, the printed circuit board 30 is formed of a flat plate member. Hence, in the process of forming the high reflective printed layer, the processing steps can be facilitated since the object on which the high reflective printed layer is printed is of the flat plane.

Further, the yield rate of manufacturing is thus improved so that the device can be manufactured at a low cost.

The mechanism of respective indicator 40 is provided so that the respective indicators correspond to the indexes 11a to 11d of the dial plate 10. This mechanism of the indicator 40 includes the mechanism of a fuel indicator 41 which corresponds to the remaining fuel index 11a, the mechanism of a speed indicator 42 to the speed index 11b, the mechanism of an engine RPM indicator 32 to the engine RPM index 11c, and the mechanism of a water temperature indicator 44 to the water temperature index 11d.

The mechanism of these indicators 41 to 44 are provided for corresponding information display, and comprised of respective internal mechanisms 41a to 44a for rotating pointer shafts included in themselves and respective pointers 41b to 41d for indicating corresponding indexes 11a to 11d, as shown in FIG. 1.

The internal mechanisms 41a to 44a are positioned at the back face of the printed circuit board 30, and are screw into and fixed to respective installation holes 26a to 26d through the installation members 41c to 44c. By this fixing, there is provided simultaneously an electric connection between the respective internal mechanisms 41a to 44a and the printed circuit board 30.

With the internal mechanisms 41a to 44a thus fixed, the pointer shafts provided with the internal mechanisms 41a to 44a are extruded from the front face through the holes provided in the dial plate 10, the optical guide plate 20, and the printed circuit board 30.

Meanwhile, the pointers 41b to 44b are mounted on the respective shafts in the vicinity of the front face of the dial plate 10, as shown in FIGS. 1 and 2.

In this configuration, the pointers 41b to 44b are mounted on the pointer shafts of the internal mechanisms 41a to 44a, and are rotated to angular positions where correspond to respective amounts to be displayed in accordance with electric signals supplied to the internal mechanisms 41a to 44a through the printed circuit board 30.

Figure 5:
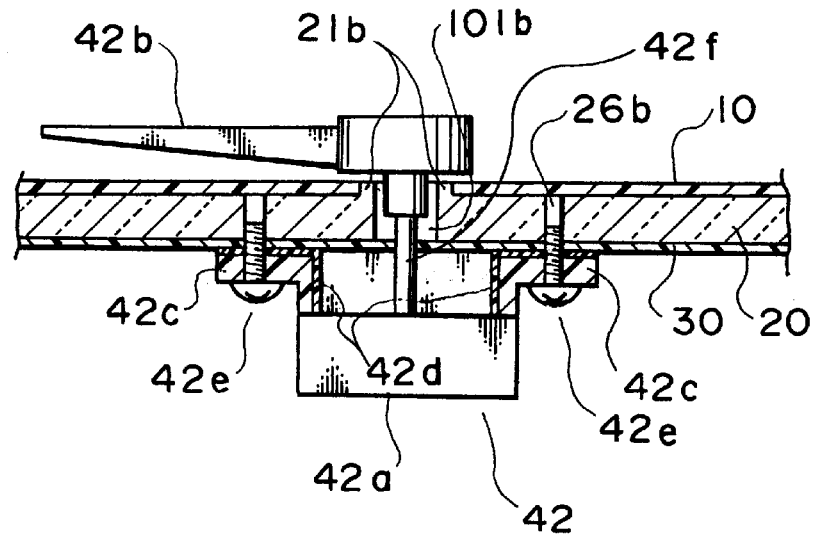
FIG. 5 is a cross-sectional view of a main part of the pointer type indicator illustrating the mechanism of a speed indicator or the indicating mechanism.

For example, as for the speed indicator mechanism 42, as shown in FIG. 5, flanges 42c which are bent into a shape having an L-shaped cross-section and that connection terminals 42d to a shape having an L-shaped cross-section are provided at the front portion of the internal mechanism 42a.

Further, the connection terminals 42d are held against the printed circuit board by the flanges 42c, and the flanges 42c are then fixed to the optical guide plate 20 by screws 42e. In this manner, the internal mechanism 42a is installed, and simultaneously, an electric connection is provided between the connection terminals 42d and the printed circuit board 30, i.e., between the internal mechanism 42a and the printed circuit board 30.

Thus, according to the structure as described above, the connection terminals 42d, which function as contact points of the internal mechanism 42a, can be positioned between the flanges 42c, which are the mounting portion of the internal mechanism 42a, and the printed circuit board 30, and then the flanges 42c and the printed circuit board 30 are held and fixed by screws 42e. In this way, an electric connection between the internal mechanism 42a and the printed circuit board 30 can be provided together with the mounting of the internal mechanism 42a.

On the other hand, the pointer 42b is mounted from the front side onto the pointer shaft 42f extending through the shaft hole 21b of the optical guide plate 20 and exposed from the front face of the dial plate 10.

The pointer 42b thus mounted is provided in the proximity of the front face of the dial plate 10, and is rotated and positioned at an angular position corresponding to a traveling speed in accordance with an electric signal supplied to the internal mechanism 42a through the printed circuit board 30, i.e., an electric signal representing speed information.

In addition, as shown in the drawings, an illumination mechanism 50 is provided at the inside of the display device to illuminate indexes 11a to 11d, pointers 41b to 44b, a shift position indicator window 14, and a warning indicator window 15.

The illumination mechanism 50 comprises illuminator light bulbs 51 and 52 for illuminating the index 11a to 11d and the pointers 41b to 44b, a shift position illuminator 54 for illuminating the shift position indicator windows 14, and a warning illuminator 55 for illuminating the warning indicator window 15.

The illuminator light bulbs 51 and 52 are contained in connector case 53. These bulbs are provided at the upper part of the optical guide plate 20 and are inserted into the illuminator bulb holes 22a and 22b of the optical guide plate 20 as described above.

Therefore, when the illuminator light bulbs 51 and 52 are turned on under this state, the illuminating light radiated from the illuminator light bulbs 51 and 52 is introduced into the optical guide plate 20 from the ends of the illuminator light bulb holes 22a and 22b, or of cylindrical surface, and is repeatedly reflected at the inside of the optical guide plate 20, thus propagating in the whole area of the optical guide plate 20.

Further, the transparent index portion 11 provided at the dial plate 10 is illuminated by the illuminating light thus propagated within the whole area of the optical guide plate 20.

In addition, the respective parts of the printed circuit board 30 corresponding to the connector case 53 are bent along the back face of the connector case 53, and are kept in contact with the back face. The illuminator light bulbs 51 and 52 are installed so as to hold the printed circuit board 30 and the connector cases 53, and the installation of these bulbs 51 and 52 are simultaneously have electric connections with the printed circuit board 30 when they are installed.

The shift position illuminator 54 comprises a shift position indicating bulb 54a and a lamp case 54b, as shown in FIG. 2, and is provided at the central part of the dial plate 10 in normal to the width of the dial plate 10.

The warning illuminator 55 also comprises a warning light bulb 55a and a lamp case 55b, and is provided at the lower part of the optical guide plate 20 under the engine speed display index 11c in the dial plate 10.

Figure 6:
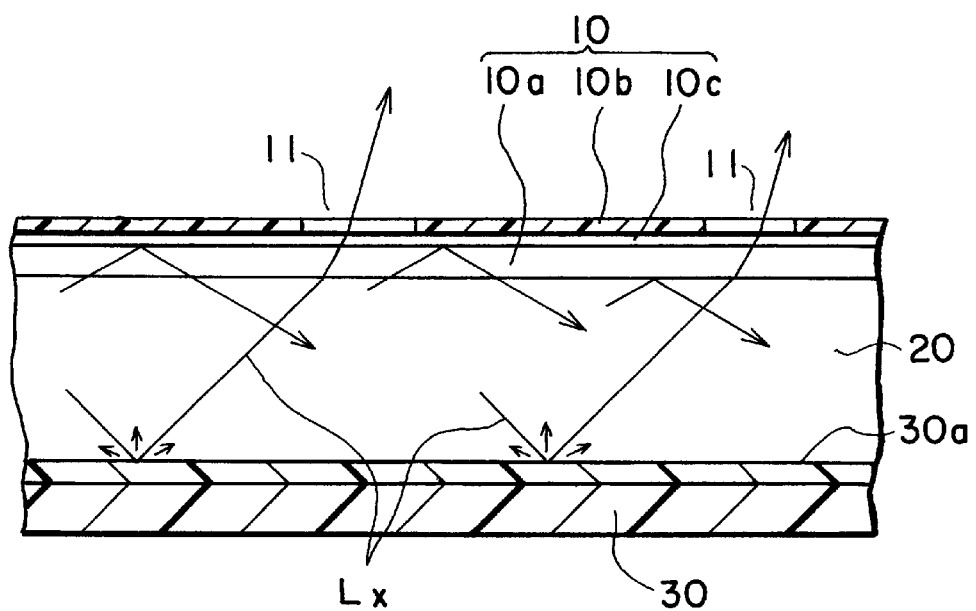
FIG. 6 is an enlarged partly cross-sectional view showing reflection of illuminating light in the optical guide plate.

Now the state of illumination at the inside of the optical guide plate 20 of the display device, which has the structure of the above will be described. FIG. 6 illustrates a state of reflection of the illuminating light within the optical guide plate 20, wherein an enlarged partly cross-sectional view of the dial plate 10, the optical guide plate 20, and the printed circuit board 30 is shown.

As shown in this figure, the dial plate 10 comprises a flat optical guide member 10a formed of a transparent resin material such as of acrylic resin plate, polycarbonate resin plate and the like, a non-transparent layer 10b covering the front face of the optical guide member 10a, and a light reflecting layer 10c formed between the optical guide member 10a and the non-transparent layer 10b.

The non-transparent layer 10b is formed, for example, of a printed layer consisting of a black paint which includes the index portion 11 formed by punched characters, or non-printed regions. The light reflecting layer 10c is formed of a printed layer made of transparent material of a white-based color such as milky white.

A white printed layer 30a is formed on the surface of the printed circuit board 30 which faces to the optical guide plate 20 as explained above.

In this structure, the illuminating light Lx, which is indicated by arrows in the figure, introduced into the optical guide plate 20 from the illuminator light bulbs 51 and 52 propagates within the optical guide plate 20 by repeatedly reflecting at the boundary planes with the dial plate 10 (the light reflecting layer 10c) and the printed circuit board 30 (the white printed layer 30a).

In this state, since the white printed layer 30a is formed on the printed circuit board 30, a reflectance of the back face of the optical guide plate 20, which is faced to the printed circuit board 30, for the illuminating light Lx is greatly improved.

Likewise, the light reflecting layer 10c is formed on the dial plate 10. Since this light reflecting layer 10c is comprised of a transparent material of milky white, the light reflecting layer 10c functions as a reflecting layer capable of reflecting and transmitting the illuminating light incident upon the surface thereof.

Accordingly, a part of the illuminating light reaches to the index portion 11 after passing through the inside of the light reflecting layer 10c, while the other part of the illuminating light which reaches other than the index portion 11 is reflected back toward white printed layer 30a of the printed circuit board 30 after being reflected at the boundary between the light reflecting layer 10c and the non-transparent layer 10b.

In this way, according to the structure as described above, since there is provided the white printed layer 30a which reflects the illuminating light Lx propagating backward within the optical guide plate 20 to a direction toward the front face thereof, it becomes possible to brightly illuminate the whole area of the dial plate 10, or the entire area of the index portion 11.

In addition, the index portion 11 formed on the face of the dial plate 10 is thus brightly illuminated and, at the same time, the whole of the dial plate can be brightly illuminated.

The light reflecting member, i.e., the white printed layer 30a of the structure as described above is a layer printed on the surface of the printed circuit board 30 and forms an integral part of the printed circuit board 30. However, the light reflecting member may be formed independently from the printed circuit board 30.

In the next preferred embodiment of the present invention, the light reflecting member is formed independently from the printed circuit board 30.

Figure 7:
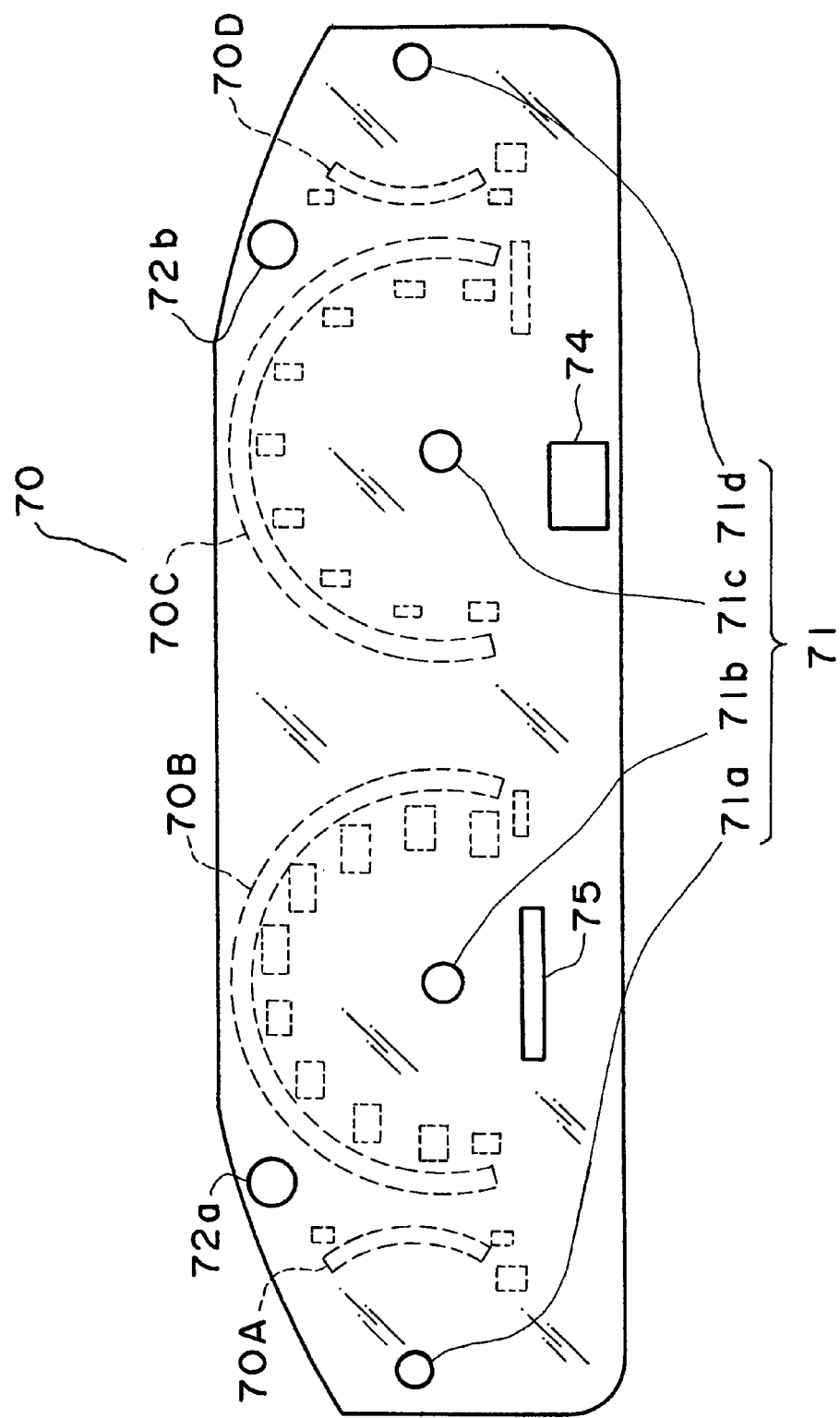
FIG. 7 is a front view illustrating a structure of a reflecting sheet.

FIG. 7 is a front view of a light reflecting sheet employed in another embodiment of the present invention, wherein the light reflecting member is of an independent light reflecting sheet.

As shown in this figure, the light reflecting sheet 70 is formed into a sheet-like member which has substantially the same shape as of the optical guide plate 20 described above. The surface of the sheet 70 is formed of a color such as white which has a high reflectance.

This light reflecting sheet 70 is also provided with mounting holes for mounting various electric elements Like the optical guide plate 20 explained by referring to FIG. 4.

Specifically, there are provided holes 71 corresponding to the shaft holes 21 of the optical guide plate 20, holes 72a and 72b also corresponding to the illuminator light bulb holes 22a and 22b, a hole 74 corresponding to the warning illuminator installation hole 24, and a hole 75 corresponding to the distance information indicator installation hole 25.

In addition, the index regions 20A to 20D of the optical guide plate 20, i.e., crimping regions having a function of diffusing the illuminating light are positioned on the surface of the light reflecting sheet 70 faced to the optical guide plate, or on the regions 70A to 70D where correspond respectively to the remaining fuel index 11a and water temperature index 11d of the index portions 11 of the dial plate 10 as described with reference to FIG. 1.

Figure 8:
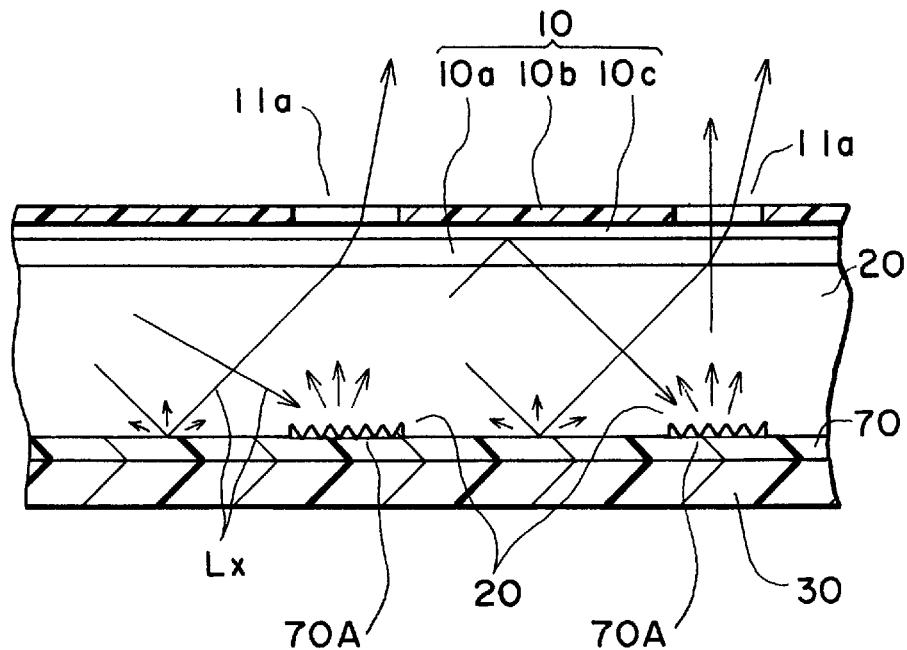
FIG. 8 is an enlarged partly cross-sectional view showing reflection of illuminating light in the optical guide plate having the reflecting sheet.

Further, the light reflecting sheet 70 and the above described index regions 20A to 20D of the optical guide plate 20 work cooperatively with each other to reflect and diffuse the incident light such as to the index region 20A and direct the reflected and defused illuminating light toward the dial plate 10, as shown in the enlarged partly cross-sectional view of FIG. 8.

Further, the light thus diffused reaches the remaining fuel index 11a after passing through the light reflecting layer 10c of the dial plate 10, which remaining fuel index 11a is formed by the removal of the non-transparent layer 10b.

In this state, the remaining fuel index 11a is illuminated by the diffused light and, therefore, the remaining fuel index 11a is uniformly illuminated.

On the other hand, the illuminating light Lx incident upon the region other than the index region 20A is reflected by the reflecting sheet 70 having a high reflecting surface and propagates away from the illuminator light bulb holes 22a and 22b. This illuminating light is further repeatedly reflected within the optical guide plate 20 and propagates to the whole are of the optical guide plate 20.

Thus, according to the structure described above, the diffusion/reflection regions or the index regions 20A to 20D provided on the optical guide plate 20 and the light reflecting sheet 70 provided on the back surface of the optical guide plate 20 work cooperatively with each other to reflect and diffuse the incident light thereupon toward the corresponding index portions 11 of the dial plate 10 while the rest of the illuminating light incident upon the region other than the above is totally reflected by the light reflecting layer 70 and propagates away from the illuminator light bulb holes 22a and 22b within the optical guide plate 20.

Therefore, the index portions 11 can be illuminated uniformly and brightly, and at the same time, the whole area of the dial plate 10 is also illuminated brightly.

In the above described embodiment, the flexible board has been used in the printed circuit board 30, however, it is also possible to use a hard circuit board which does not have the flexibility.

When the flexible board is used in the printed circuit board, however, the printed circuit board can easily be accommodated to the rugged plane at the back face of the optical guide plate 20 and rugged plane caused by electric elements, such as the connector case 53, shift position illuminator 54 and the like, and other members projecting from the back face of the optical guide plate 20.

In the structure described above, the dial plate 10 and the optical guide plate 20 are provided in contact with each other. According to this structure, it is advantageous that the indicator device can be decreased in thickness.

Now, another embodiment of the present invention will be described hereinafter. In this embodiment, the dial plate 10 and the optical guide plate 20 are spaced apart from each other with a predetermined distance to make a space therebetween.

Figure 9:
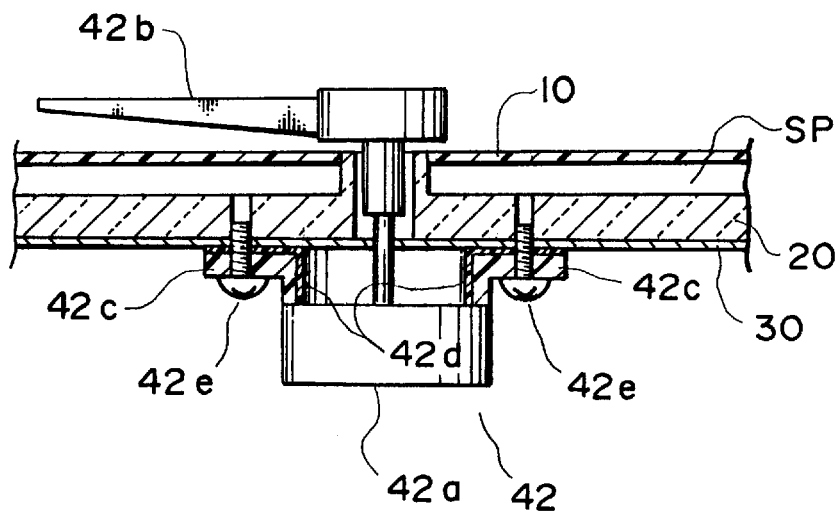
FIG. 9 is an enlarged partly cross-sectional view of the mechanism of the speed indicator wherein a space is provided between a dial plate and the optical guide plate.

FIG. 9 is an enlarged partly cross-sectional view of the speed indicator mechanism 42 illustrating this type of configuration.

As shown in this figure, the dial plate 10, the optical guide plate 20, the printed circuit board 30, and the speed indicator mechanism 42 including the internal mechanism 42a and the pointer 42b are substantially the same in structure with that of the embodiment described with reference to FIG. 5.

Figure 10:
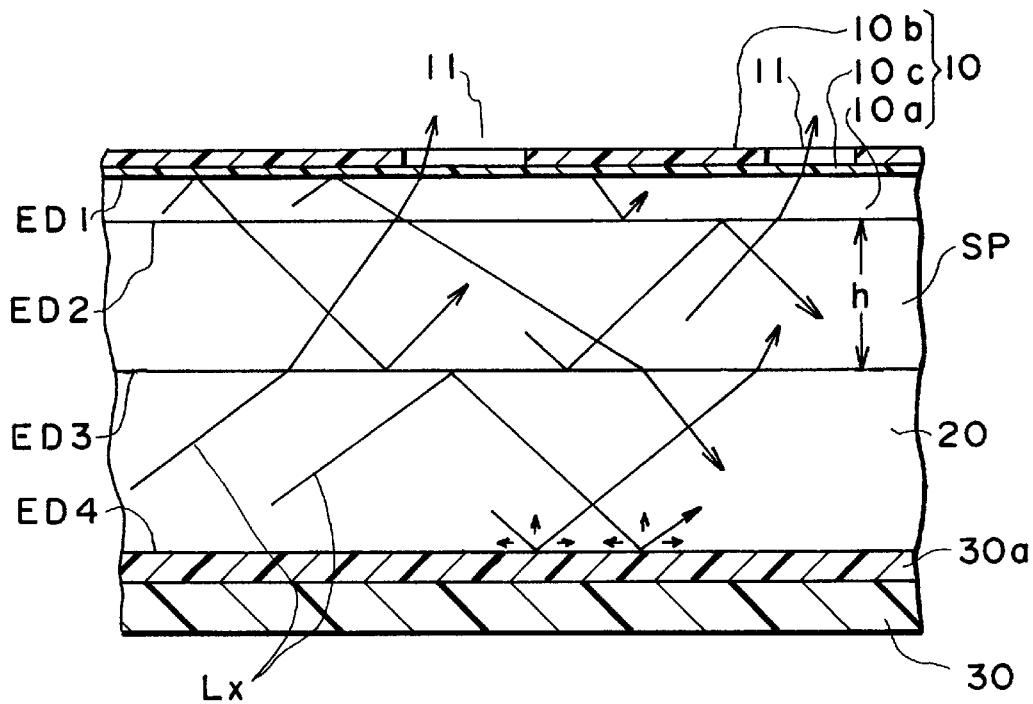
FIG. 10 is an enlarged partly cross-sectional view showing reflection of illuminating light in the optical guide plate having the space between the dial plate and the optical guide plate.

The difference between this structure and that of FIG. 5 is that, as shown in a partly enlarged cross-sectional view of FIG. 10, the dial plate 10 or the optical guide member 10a is spaced apart from the front face of optical guide plate 20 by a distance h.

Thus, since the dial plate 10 is spaced apart from the optical guide plate 20 by a distance h a space SP is formed therebetween.

In this case, since the refractive index of the space SP is different from the refractive index of the optical guide member 10a, the illuminating light Lx is reflected at boundary planes ED1 to ED4 such as existing between the space SP and the optical guide plate 20 and the optical guide member 10a in different ways, such as totally reflected or partially reflected as indicated by arrows in the figure, depending upon angles of incidence. More precisely, a part of the illuminating light Lx is totally reflected and propagates into an abutting area such as the space SP, the optical guide plate 20 and the optical guide member 10a, while another part of the illuminating light is repeatedly reflected within the optical guide plate 20 and the optical guide member 10a.

Thus, according to this embodiment, all of the back face ED1 of the light reflecting layer 10c, the boundary planes ED2 and ED3 between the space SP and the optical guide plate 20 and the optical guide member 10a, and the surface ED4 of the white printed layer 30a function as reflecting surfaces for illuminating light Lx.

Compared with the structure shown in FIG. 5, when the illuminating light is reflected at the boundaries planes ED2 and ED3 in this embodiment, a number of times in reflection is greater than that of FIG. 5 and a traveling distance of the illuminating light between the reflections is shortened, so that the illuminating light can be propagated to the very end of the dial plate 10 and the uniformness of illumination can be much more improved in this embodiment.

In the structure as described above, the back face of the light reflecting layer 10c and the back face of the optical guide member 10a are used as reflecting surfaces. However, a reflecting layer may be provided on the back face of the optical guide member 10a.

Figure 11:
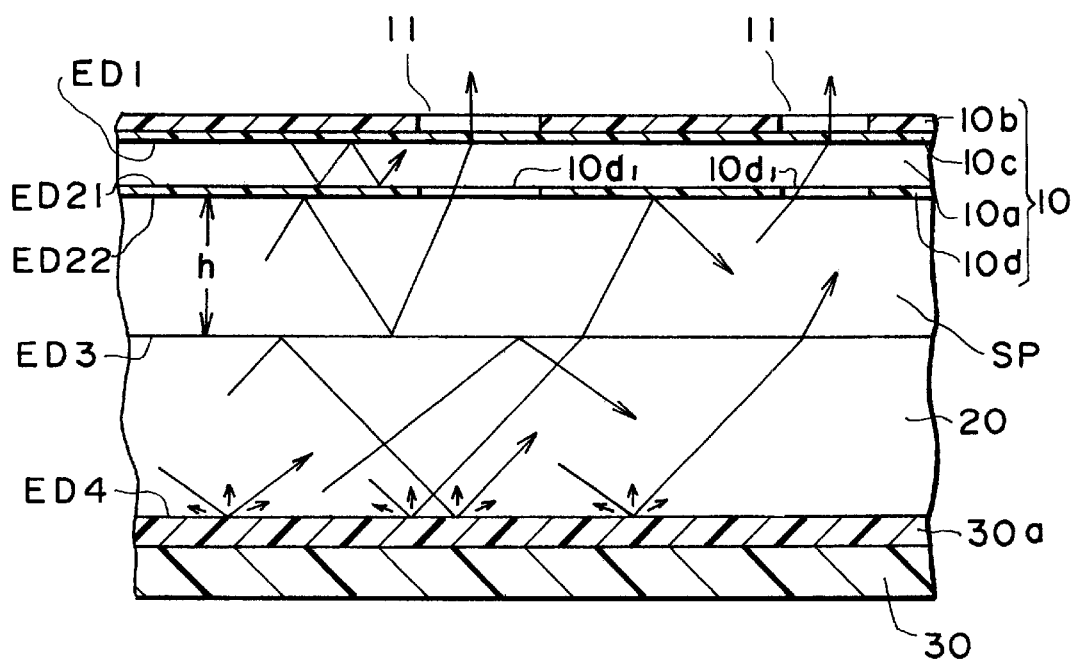
FIG. 11 is an enlarged partly cross-sectional view showing reflection of illuminating light in the optical guide plate having a reflecting layer at the back face of the dial plate.

Specifically, in the structure shown in FIG. 11, there is provided a second white printed layer 10d on the back face of the optical guide member 10a for using this layer 10d as a reflecting layer. This second white printed layer 10d consists of a non-transparent reflecting member provided by the process of hot stamping, or thermal transferring, or screen printing onto the flat surface of the optical guide member 10a in the same way as in providing the white printed layer 30a on the printed circuit board 30.

Further, window portions $10d_1$, which correspond to the index portions 11 of the dial plate 10, are provided by non-printed regions 10d of the second white printed layer 10d.

Therefore, a part of the illuminating light Lx propagating from the printed circuit board 30 passes through the window portions 10d1 and reaches to the index portions 11. The other the illuminating light Lx is totally reflected by the reflecting surface of the second white printed layer 10d, i.e., the boundary ED2, and directed toward the printed circuit board 30.

Thus, according to this embodiment of the present invention, the number of times of reflections is increased by shortening the traveling distance of the illuminating light between the reflections for achieving the uniform illumination, and since the illuminating light Lx which is not used for illuminating the index portions 11 is positively reflected back by the second white printed layer 10d toward the printed circuit board 30, an efficiency of the illumination can be improved considerably.

As has been explained above, the present invention obtains the following advantages.

Since a light reflecting member is provided on the surface of a flat circuit board which faces the optical guide plate and this light reflecting member reflects forward the illuminating light introduced into the optical guide plate, the whole dial plate can be brightly illuminated and the steps for manufacturing the light reflecting member can be facilitated.

As a result of this, the yield rate can be improved and the device can be manufactured at a low cost.

Since the light reflecting member is formed as a high reflecting type printed layer, it is possible to form a light reflecting member by a thermal transfer method as described above, so that the steps of manufacturing the device can be facilitated and the yield rate can be improved. Moreover, the light reflecting member can be made thin.

Since the light reflecting member is also formed as a sheet-like member, it is possible to provide the light reflecting member with use of an adhesive tape or an adhesive agent, so that the steps of manufacturing the device can be facilitated and the yield rate can be improved.

Since the surface of the light reflecting member or the reflecting surface can be formed as a white reflective surface, the indexes provided at the dial plate can be illuminated in white by the effect of the surface color of the light reflecting member, so that the recognition of the indexes can be improved.

Since diffusion/reflection regions are provided on the surface of the optical guide plate, the illuminating light impinging on such regions of the optical guide plate is reflected as a diffused state, so that the entire dial plate can be illuminated brightly and uniformly.

Since the illuminating light reached to the index portions is made to propagate through the inside of the light reflecting layer, while the other illuminating light which does not reach to the index portions is made to reflect by providing a non-transparent layer behind the light reflecting layer and direct toward the back side or toward a light reflecting layer of the circuit board as described above. Therefore, the index portions can be illuminated brightly and that the entire dial plate simultaneously.

Since the dial plate and the optical guide plate are separated with a predetermined distance from each other to make a space therebetween, the traveling distance of the illuminating light to the next reflection can be shortened so that the number of times of the reflection is increased. Therefore, it is possible to provide more uniform illumination.

Since a second reflecting member having transparent windows which correspond to the index portions is provided so that the illuminating light which is not used for illuminating the index portions is positively reflected toward the circuit board, the illumination efficiency of the illuminating light can be much more improved.

Since the circuit board is formed as a flexible circuit board which is of a thin plate member having flexibility, formation of a light reflecting member can be facilitated and the handling of the circuit board can be made easier when adhering it on the optical guide plate. Further, the circuit board can easily be accommodated to shapes of rugged portions provided on the back face of the optical guide plate, rugged portions caused by electric elements and other members projecting from the back face of the optical guide plate.

Since contacts of electric elements are interposed between the circuit board and flanges, or mounting portions, of the electric elements and since the electric connection between the flanges and the circuit board are provided by securing them to fix, the electric connection can be obtained simultaneously with the installation of the electric elements.

What is claimed is:

1. A pointer type indicator comprising:
   a dial plate having a non-transparent layer with transparent indexes corresponding to information to be indicated, a light reflecting layer disposed on a back face of the non-transparent layer, and an optical guide member disposed on a back face of the light reflecting layer;
   at least one pointer provided adjacent to a front face of the non-transparent layer of the dial plate;
   an optical guide plate provided adjacent to a back face of the optical guide member of the dial plate for guiding illuminating light from at least one illuminating light source to the entire area of the front face of the dial plate through the optical guide member and the transparent indexes;
   a circuit board having at least one circuit pattern formed thereon, said circuit pattern being used for transmitting an electric signal;
   at least one electric element operated by the signal fed from the circuit board, the at least one electric element is mounted on a back face of the optical guide plate through the circuit board; and
   a light reflecting member being provided on a surface of the circuit board which faces the optical guide plate.

2. A pointer type indicator as defined in claim 1, wherein said light reflecting member is a highly reflective printed layer formed on the circuit board.

3. A pointer type indicator as defined in claim 1, wherein said light reflecting member is a sheet-like member independent from the circuit board.

4. A pointer type indicator as defined in claim 2 or 3, wherein said light reflecting member is a white reflecting surface.

5. A pointer type indicator as defined in claim 2 or 3, wherein at least one crimped reflecting region is provided on the optical guide plate facing the light reflecting member.

6. A pointer type indicator as defined in claim 1, wherein said light reflecting layer is formed of transparent material of white-based color.

7. A pointer type indicator as defined in claim 6, wherein said dial plate and optical guide plate are spaced apart from each other with a predetermined distance therebetween.

8. A pointer type indicator as defined in claim 6, further comprising a second light reflecting member provided on the back face of the optical guide member, in contact with the optical guide member, with transparent windows corresponding to the index portions.

9. A pointer type indicator as defined in any one of claim 1, 2, or 3, wherein said circuit board is formed of a flexible circuit board.

10. A pointer type indicator as defined in any one of claim 1, 2, or 3 further comprising contact points of the circuit board provided on the back side thereof to make at least one electrical connection with the at least one electric element;
   flanges projecting from a front end of the at least one electric element for mounting to the back side of the circuit board; and
   contacts of the at least one electric element interposed between the circuit board and the flanges and fixed by fixing means, whereby the at least one electrical connection is obtained simultaneously with the installation of the at least one electric element.

* * * * *